US006407961B1

United States Patent
Perets et al.

(10) Patent No.: US 6,407,961 B1
(45) Date of Patent: Jun. 18, 2002

(54) DUAL ACCESS MEMORY ARRAY

(75) Inventors: Ronen Perets, Herzelia; Yael Gross, Ramat Gan; Bat-Sheva Ovadia, Hod Hasharon; Avigdor Faians, Herzelia; Eran Briman, Kirlat Ono; Rakefet Freedman, Raanana; Ilana Tal, Herzelia, all of (IL)

(73) Assignee: DSP Group, Ltd., Herzlia (IL)

( * ) Notice: Subject to any disclaimer, the term of this patent is extended or adjusted under 35 U.S.C. 154(b) by 0 days.

(21) Appl. No.: 09/709,401

(22) Filed: Nov. 13, 2000

Related U.S. Application Data

(62) Division of application No. 09/226,397, filed on Jan. 6, 1999, now Pat. No. 6,188,632.

(30) Foreign Application Priority Data

Jun. 11, 1998 (IL) ............................................... 124863

(51) Int. Cl.$^7$ ................................................ G11C 8/00
(52) U.S. Cl. ........................... 365/230.04; 365/230.02; 365/230.03; 365/230.06
(58) Field of Search ....................... 365/230.04, 230.06, 365/230.02, 230.03, 230.05

(56) References Cited

U.S. PATENT DOCUMENTS

| | | | | |
|---|---|---|---|---|
| 4,393,472 A | * | 7/1983 | Shimada et al. ............ | 365/190 |
| 4,608,672 A | * | 8/1986 | Roberts et al. ......... | 365/230.04 |
| 4,773,048 A | * | 9/1988 | Kai ....................... | 365/230.03 |
| 5,212,780 A | * | 5/1993 | Padgaonkar et al. ... | 365/230.04 |
| 5,293,623 A | * | 3/1994 | Froniewski et al. ........ | 365/221 |
| 5,502,683 A | | 3/1996 | Marchioro | |
| 5,517,457 A | * | 5/1996 | Sakui et al. ............ | 365/230.03 |
| 5,559,990 A | * | 9/1996 | Cheng et al. ................ | 711/157 |
| 5,757,689 A | * | 5/1998 | Seno ........................... | 365/72 |
| 5,854,770 A | * | 12/1998 | Pascucci ................ | 365/230.03 |
| 6,085,280 A | * | 7/2000 | Zink ............................. | 711/5 |
| 6,188,632 B1 | * | 2/2001 | Perets et al. ........... | 365/230.04 |

* cited by examiner

*Primary Examiner*—David Nelms
*Assistant Examiner*—Gene N. Auduong
(74) *Attorney, Agent, or Firm*—Eitan, Pearl, Latzer & Cohen-Zedek

(57) ABSTRACT

A memory array includes a memory unit and a dual access controller. The memory unit stores a multiplicity of words and has a plurality of word lines each of which accesses a row of words. The memory unit is divided into a left memory unit and a right memory unit, each having generally half of the storage space of the memory unit, the left memory unit having left half word lines and the right memory unit having right half word lines. The dual access controller receives a word address N and a word separation amount S and activates the columns and half rows of the memory unit in which a main word and a second word S words from the main word are found. In one embodiment useful for neighboring words, the left memory unit holds the words with even addresses and the right memory unit holds the words with odd addresses. In another embodiment, the left memory unit holds the first four words of an eight word set and the right memory unit holds the second four words. The dual access controller includes a multiple row main controller and a half row line decoder. The multiple row main controller receives the word address N and the word separation amount S and activates column and output multiplexers. It also determines the half row or rows on which the main and second words are found. The half row line decoder activates the half row or rows as indicated by the multiple row main controller.

9 Claims, 6 Drawing Sheets

DUAL ACCESS MEMORY ARRAY

This application is a divisional of U.S. patent application Ser. No. 09/226,397 filed Jan. 6, 1999 now U.S. Pat. No. 6,188,632 and entitled "Dual Access Memory Array".

FIELD OF THE INVENTION

The present invention relates to memory arrays in general and in particular, to dual access memory arrays which include cache memories.

BACKGROUND OF THE INVENTION

Memory arrays hold a plurality of words which often have to be accessed in order. Sometimes, for speed and space reasons, the memory is divided into two halves, as shown in FIG. 1 to which reference is now briefly made. Each of the two halves, labeled 10 and 12, have rows 14 therein in which data in the form of "words" are stored. The first four words, labeled 0–3, are stored in the lowest row 14*al* of the left half 10, the second four words, labeled 4–7. are stored in lowest row 14*ar* of the right half 12, the third four words, labeled 8–11, are stored in row 14*bl* of the left half 10, and the fourth four words, labeled 12–15, are stored in row 14*br*, etc.

The memory array also includes a main controller 15 which converts an address of a word into associated row and column addresses, a line decoder 16 which selects the same row (14*a* or 14*b*) of each of the two halves 10 and 12 as indicated by the main controller 15, separate four-to-one multiplexers (MUX) 18 and 20, each for reading data from their corresponding one of the two halves 10 and 12, separate sense amplifiers 24 and 26, a two-to-one MUX 22 for providing data from one of the two sense amplifiers 24 or 26 and an output buffer 23. For writing data, the memory array includes two precharge and write buffer units 25A and 25B.

To access a word, the main controller 15 first determines which row and column the word is in. Main controller 15 then provides the row address to the line decoder 16, the column address to the proper MUX 18 or 20 and a select signal to the 2:1 MUX 22. The line decoder 16, in turn, activates the word line, labeled 28, connecting the eight words of a row 14 and the MUXs 18, 20 and 22 select the relevant column holding the word of interest. For example, to read word 3, line decoder 16 activates word line 28*a*, MUX 18 selects the relevant (i.e. the rightmost column) column and MUX 22 selects its left input (from sense amplifier 24). To read word 4, line decoder 16 activates word line 28*a*, MUX 20 selects the relevant column (i.e. the leftmost column) and MUX 22 selects its right input (from sense amplifier 26). The output buffer 23 provides the data of MUX 22 as the output, labeled "DATA OUT", of the memory array.

Some memories are read in order. To read first word 0 and then word 1, the line decoder 16 has to activate word line 28 twice and MUX 18 has to select two different columns. Thus, two different read operations are required. Similarly, for any two words in the same row of one half 10 or 12 of the memory, two read operations are required. However, reading words 3 and 4 can be done in a single read operation, since the line decoder 16 has to activate the same word line, line 28*a*, and both of the MUXs 18 and 20 select their respective columns at the same time.

Unfortunately, not all adjacent words in the two halves can be read in a single operation. Adjacent words of different rows require separate read operations. For example, to read words 7 and 8, requires a first read operation in which word line 28*a* is activated to read word 7 and then a second read operation in which word line 28*b* is activated to read word 8. Thus, for most neighboring words, consecutive read operations are required.

Similar access operations occur for writing data into the memory halves 10 and 12. The main controller provides the row and column signals to the line decoder 16 and the MUXs 18 and 20, respectively. At the same time, the data to be input, labeled "DATA IN", is provided to the precharge and write buffer units 25A and 25B. Due to the access operations of the MUXs 18 and 20 and the line decoder 16, the data will then be entered into the appropriate word.

U.S. Pat. No. 5,502,683 to Marchioro describes a dual ported memory which accesses multiple words in the memory array. To do so, it has word line switches at the boundaries of each word. When a switch is activated, it splits its row of words into left and right sections one of which is active and one of which is not. Furthermore, the switch connects the right section of its word line to the left section of the next adjacent word line. Thus, if the right section of a word line is activated, so will be the left section of the next adjacent word line. The data in the active sections is read.

SUMMARY OF THE PRESENT INVENTION

It is an object of the present invention to provide a memory array which enables any two consecutive words to be read in a single read operation.

There is therefore provided, in accordance with a preferred embodiment of the present invention, a memory array which includes a memory unit and a dual access controller. The memory unit stores a multiplicity of words and has a plurality of word lines each of which accesses a row of words. The memory unit is divided into a left memory unit and a right memory unit, each having generally half of the storage space of the memory unit, the left memory unit having left half word lines and the right memory unit having right half word lines. The dual access controller receives a word address N and a word separation amount S and activates the columns and half rows of the memory unit in which a main word and a second word S words from the main word are found. In one embodiment useful for neighboring words, the left memory unit holds the words with even addresses and the right memory unit holds the words with odd addresses. In another embodiment, the left memory unit holds the first four words of an eight word set and the right memory unit holds the second four words.

Additionally, in accordance with a preferred embodiment of the present invention, the dual access controller includes a multiple row main controller and a half row line decoder. The multiple row main controller receives the word address N and the word separation amount S and activates column and output multiplexers. It also determines the half row or rows on which the main and second words are found. The half row line decoder activates the half row or rows as indicated by the multiple row main controller.

There is also provided, in accordance with a preferred embodiment of the present invention, the half row line decoder which includes a line decoder, and even and odd half word line selectors. The line decoder is connected to the full word lines and activates the full word line N upon receipt of the word line address N. Each even half word line selector, which is associated with one even half word line, is connected between the line decoder and the associated even half word line. Similarly for the odd half word line selectors. Each odd half word line selector is connected to the even half word line selector of the row above the odd half word line selector and each even half word line selector is connected to the odd half word line selector of the row below the even half word line selector.

Finally, in accordance with a preferred embodiment of the present invention, the memory unit is one of the following types of memory units: read only memory, electrically programmable read only memory, electrically erasable programmable read only memory, and flash electrically erasable programmable read only memory.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

Figure 1:
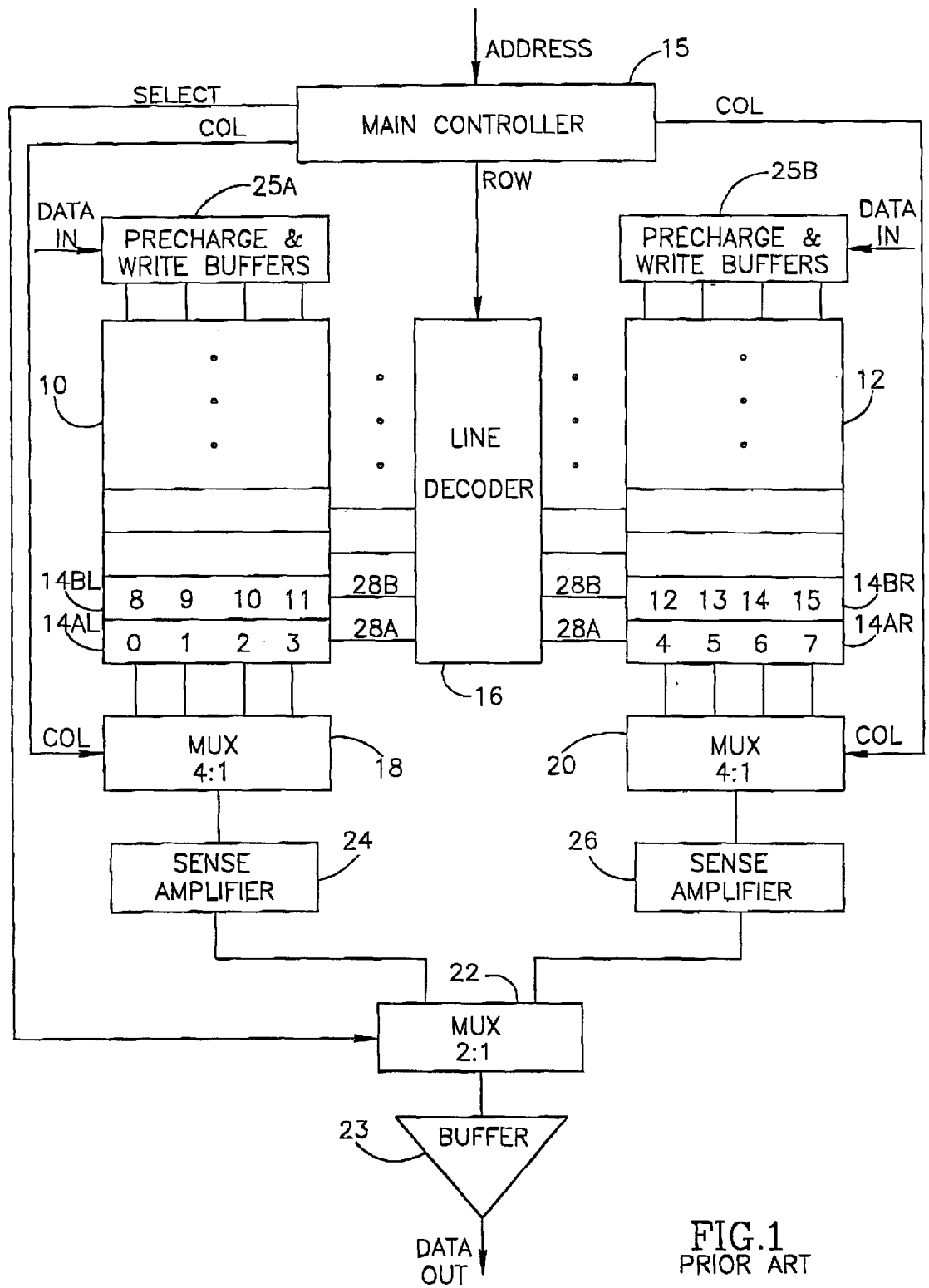
FIG. 1 is a schematic illustration of a prior art memory array.
Figure 2:
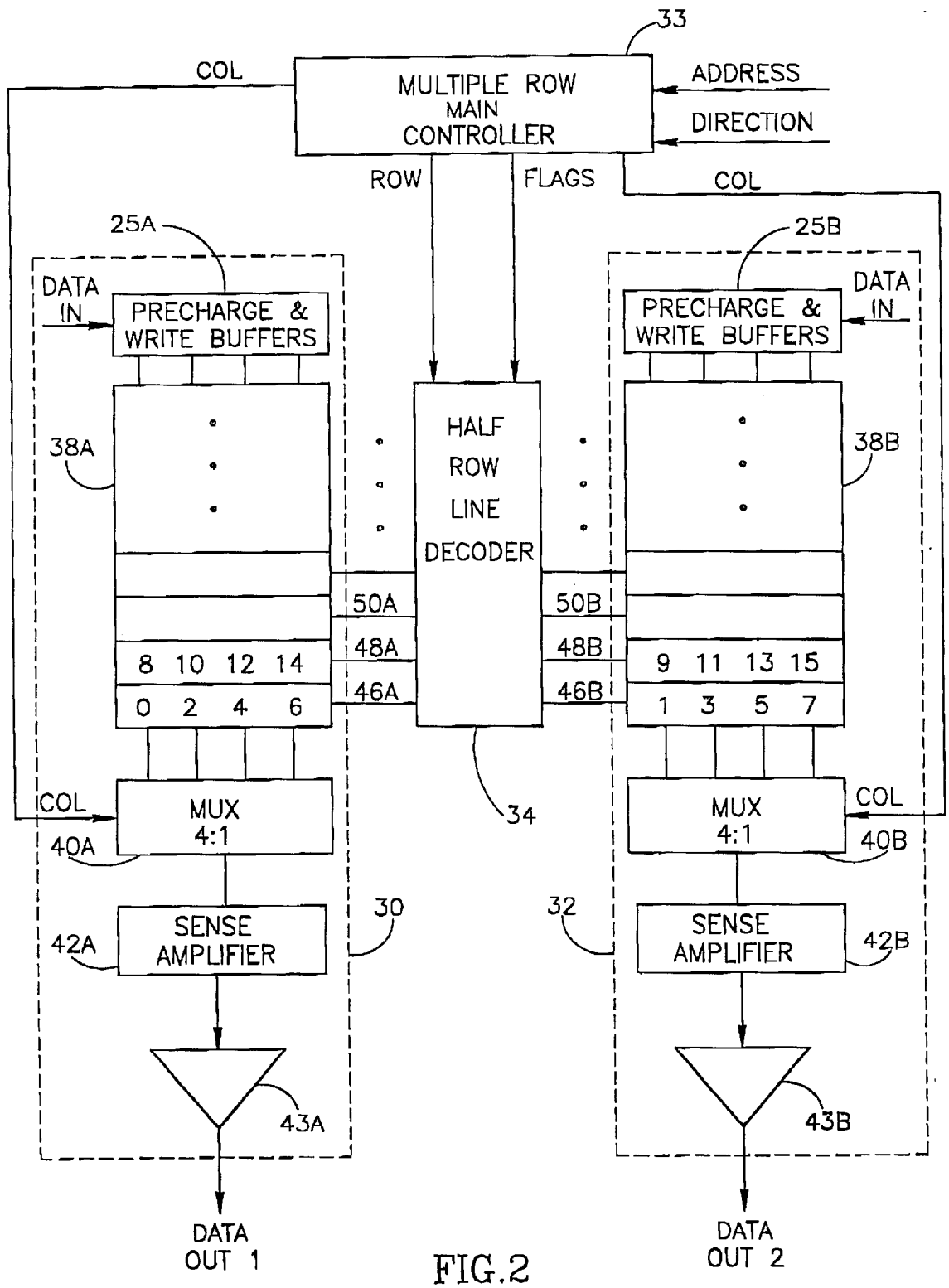
FIG. 2 is a schematic Illustration of a memory array, constructed and operative in accordance with a preferred embodiment of the present invention, wherein consecutive words can be generally simultaneously addressed.

Reference is now made to FIG. 2 which illustrates the dual access memory array, constructed and operative in accordance with a preferred embodiment of the present invention. The memory array comprises an even portion 30, an odd portion 32, a multiple row main controller 33 and a half-row line decoder 34. Each portion comprises a precharge and write buffer unit 25, a memory unit 38, a 4:1 MUX 40, a sense amplifier 42 and a buffer 43 wherein the elements of the even portion 30 are denoted with an "A" and those of the odd portion 32 with a "B".

It will be appreciated that the memory units can be any type of memory unit such as: read only memory, electrically programmable read only memory, electrically erasable programmable read only memory, and flash electrically erasable programmable read only memory.

In accordance with a preferred embodiment of the present invention, the memory unit 38A of the even portion 30 stores words with even addresses and the memory unit 38B of the odd portion 32 stores words with odd addresses, as indicated in FIG. 2. This arrangement ensures that any two consecutive words can be simultaneously addressed. For example, if words 2 and 3 are to be addressed, MUX 40a selects the column of word 2 (second from the left) and MUX 40b selects the column of word 3 (also second from the left). Similarly for words 8 and 7 and any other pair of consecutive words.

In order to access a word, the word line connecting the row in which the word exists must also be activated (in addition to the selection activity of the MUXs 40). Three word lines of FIG. 2 are labeled 46, 48 and 50, where the halves are labeled A and B since they respectively connect to the even and odd memory units 38.

In accordance with a preferred embodiment of the present invention, the half-row decoder 34 activates two neighboring half word lines depending on Which neighboring words must be accessed. For example, to simultaneously access words 7 and 8, half-row decoder 34 activates half word lines 46B and 48A respectively. To simultaneously access words 2 and 3, half-row decoder 34 activates half word lines 46A and 46B, respectively.

To operate the dual access memory array of the present invention, a word address (of N bits as desired) is provided to multiple row main controller 33 along with a two bit direction signal indicating in which direction, above or below, to take the second word. Thus, if the word address indicates word 7, the direction variable would indicate if the other word to be accessed is word 6 or word 8. Even though accessing words 6 and 7 by using address 6 and increasing to word 7 produces the same result as addressing word 7 and decreasing to word 6, the two operations are different and depend on how the controlling software chooses to access the data.

With the direction signal and the word address, the main controller 33 determines the appropriate row and column addresses, as in the prior art, with which to access the main and second words. It is noted that the column address of the main word points to a column in one memory unit and that of the second word points to a column in the other memory unit. This is guaranteed by the fact that one word resides in an even address location, while the other word resides in an odd address location. Therefore, the column addresses are separately provided to the two MUXs 40.

In order to ensure dual access in a single read operation, the main controller 33 provides a single row address, that of the main word, to the half-row decoder 34. The single row address selects the half word line for the main word. In addition, the main controller 33 translates the row address of the second word to a series of flags which select the appropriate half word line to which the second word is connected. From the row address and flags, the half-row decoder 34 activates the relevant two word lines for accessing the main and second words.

In accordance with a preferred embodiment of the present invention, each 4:1 MUX 40 has its own associated sense amplifier 42A or 42B, which reads the data stored in the addressed word, and an output buffer 43A or 43B, respectively, which provides the sensed data, "DATA OUT 1" and "DATA OUT 2", to the outside. Thus, the memory array of the present invention accesses and outputs two words of the array simultaneously.

It will be appreciated that the two words can be simultaneously written to the memory array of FIG. 2. The data to be stored (DATA IN) is provided to the precharge and write buffer units 25A and 25B and the appropriate locations are activated through the half row line decoder 34 and the MUXs 40A and 40B as described hereinabove.

It will further be appreciated that the memory array of FIG. 2 can also be utilized to access a single word. To do so, the memory array just activates a single half row, only one of the MUXs 40, one sense amplifier 42 and one buffer 43.

Figure 3:
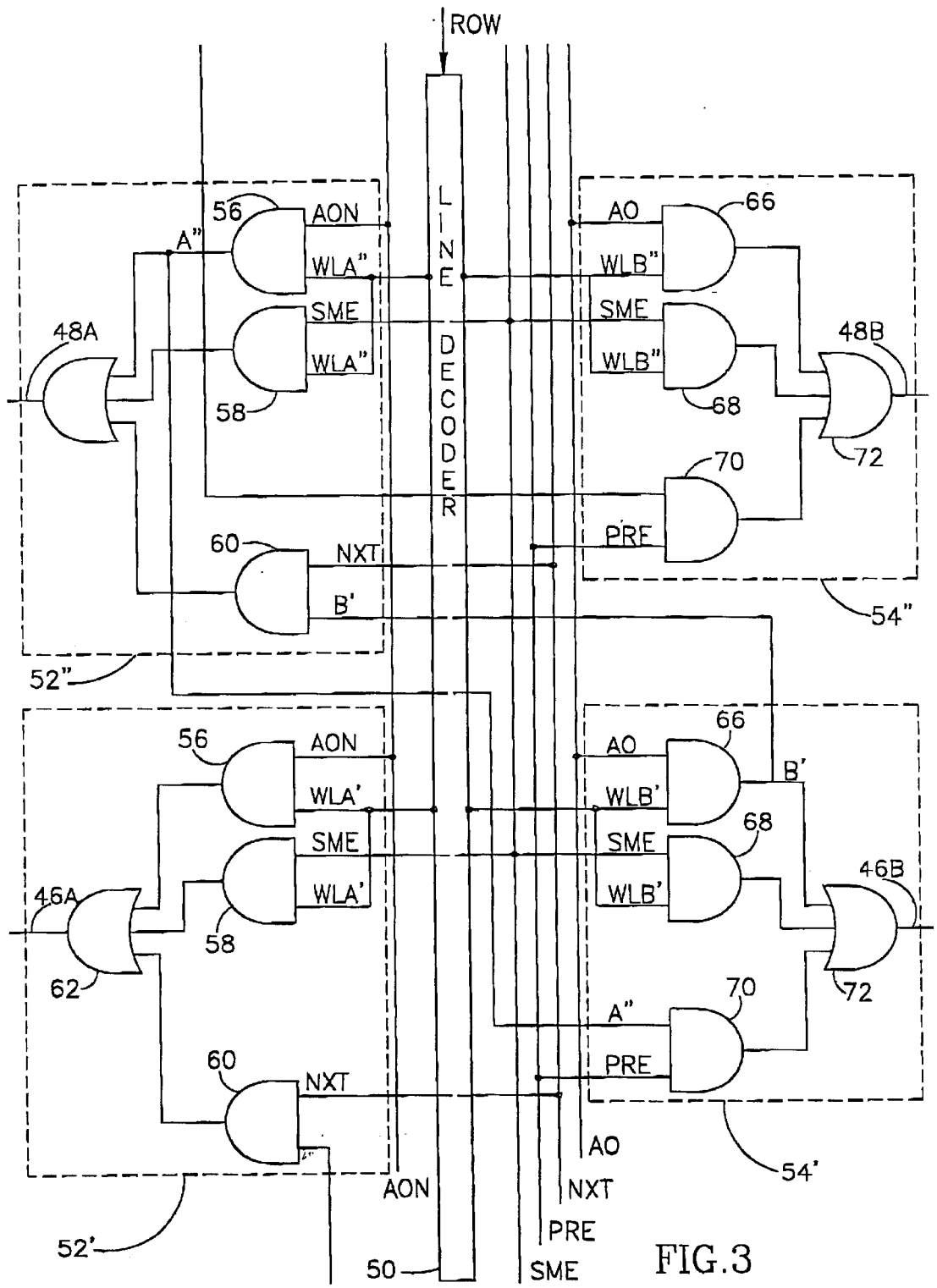
FIG. 3 is a circuit diagram of a half row line decoder forming part of the memory array of FIG. 2.

Reference is now made to FIG. 3 which illustrates one embodiment of the half-row decoder 34. Other embodiments of the half-row decoder 34 are envisioned and are incorporated herein.

FIG. 3 illustrates a portion of the half-row decoder, activating half word lines 46A, 46B, 48A and 48B. The half-row decoder of FIG. 3 comprises a line decoder 50, one even half word line selector 52 per even half word line 46A or 48A and one odd half word line selector 54 per odd half word line. The selectors 52 and 54 for word line 46 are marked with a single apostrophe' and those for word line 48 are marked with a double apostrophe".

The line decoder 50 can be any suitable line decoder as known in the prior art.

The even half word line selector 52 comprises an even bit AND gate 56, a same line AND gate 58. a next line AND gate 60 and a result OR gate 62 which receives the outputs of AND gates 56, 58 and 60 and, accordingly, activates its associated word line 46A or 48A. The odd half word line selector 54 comprises an odd bit AND gate 66, a same line AND gate 68, a previous line AND gate 70 and a result OR gate 72 which receives the outputs of AND gates 66, 68 and 70 and, accordingly, activates its associated word line 46B or 48B.

The line decoder 50 has one output line WL per word line, where the even portion is referenced WLA and the odd portion is referenced WLB. Both portions of the output line WL are activated when the line decoder 50 receives a row address for the appropriate word line.

The last bit A0 of a word address indicates if the word is even or odd, where a "0" value for the A0 bit indicates that the word is even and a "1" value indicates that it is odd. Therefore, the last bit A0 of the currently selected word address is provided to the even and odd bit AND gates 56 and 66 to select one or the other of them. Since AND gates operate on "1" values, each odd AND gate 66 receives the last bit signal A0 as is and each even AND gate 56 receives the complement A0N of the last bit signal A0.

Each even and odd AND gates 56 and 66, respectively, also receive the respective even or odd output line WLA or WLB from the line decoder 50. Thus, each even AND gate 56 produces a high (e.g. "1") output when the word to be selected is even and connected to its associated word line. Similarly, each odd AND gate 66 produces a high output when the word to be selected is odd and connected to its associated word line. It is noted that the two even and odd AND gates 66 and 66 for a single word line will not be activated at the same time due to the complementary nature of the A0 and A0N signals and despite the activation of both portions by the line decoder 50.

If the second word to be selected is on the same row, the main controller 33 will provide a high value for the SME signal which, along with the line decoder output WLA or WLB. is input to the same line AND gates 58 and 68, respectively. For example, if the main word is word 6 and the second word is word 7, the A0N signal is high, the A0 signal is low and the SME signal is high. Since the A0N signal is high, the output of the even AND gate 56 of selector 52' is high while the output of the odd AND gate 66 of selector 54' is low. Since the SME signal is high, the output of the two same AND gates 58 and 68 are high. Thus, both result OR gates 62 and 72 produce high signals, activating the two half word lines 46A and 46B.

It is noted that the output of each odd AND gate 66 is connected to the input of the next AND gate 60 of the next row. Thus, the output of odd AND gate 66 of selector 54', denoted B', is connected to the input of the next AND gate 60 of selector 52". The output of each even AND gate 56 is connected to the input of the previous AND gate of the previous row. Thus, the output of even AND gate 56 of selector 52", denoted A", is connected to the input of the previous AND gate 70 of selector 52'. In addition, the PRE signal is input to each previous AND gate 70 and the NXT signal is input to each next AND gate 60. These connections enable the half word lines of the next and previous rows of the opposite memory unit to be activated along with the half word line of the main row.

For example, words 7 and 8 are connected to different word lines, wherein word 8 is connected to the upper half word line 48A and word 7 is connected to the lower half word line 46B. If word 7 is the main word and word 8 is the second word, the main controller 33 provides a high value for the NXT signal, a low value for the PRE and SME signals and the A0 signal is high. The line decoder 50 activates word line WL' (formed into half word lines WLA' and WLB'). Accordingly, in selector 54' only the odd AND gate 66 (with the A0 and WLB' signals as input) produces a high signal, thereby activating word line 46B to access word 7. In selector 52", only the next AND gate 60 (with the NXT and B' signals as input) produces a high signal, thereby activating word line 48A.

If word 8 is the main word and word 7 is the second word, the main controller 33 provides a high value for the PRE signal, a low value for the NXT and SME signals and the A0N signal is high, The line decoder 50 activates word line WL" (formed into half word lines WLA" and WLB"). Accordingly, in selector 52" only the even AND gate 66 (with the A0N and WLA" signals as input) produces a high signal, thereby activating word line 48A to access word 8. In selector 54', only the previous AND gate 70 (with the PRE and A" signals as input) produces a high signal, thereby activating word line 46B.

It will be appreciated that the half word line selectors 52 and 54 activate only one half word line each, even though the line decoder 50 activates both portions of the word line. It will be further appreciated that the interconnections of the even selector of one row with the odd selector of the row below it and of the odd selector of one row with the even selector above it enable the half-row line decoder 34 to select the appropriate two half word lines of any two neighboring words.

Figure 4:
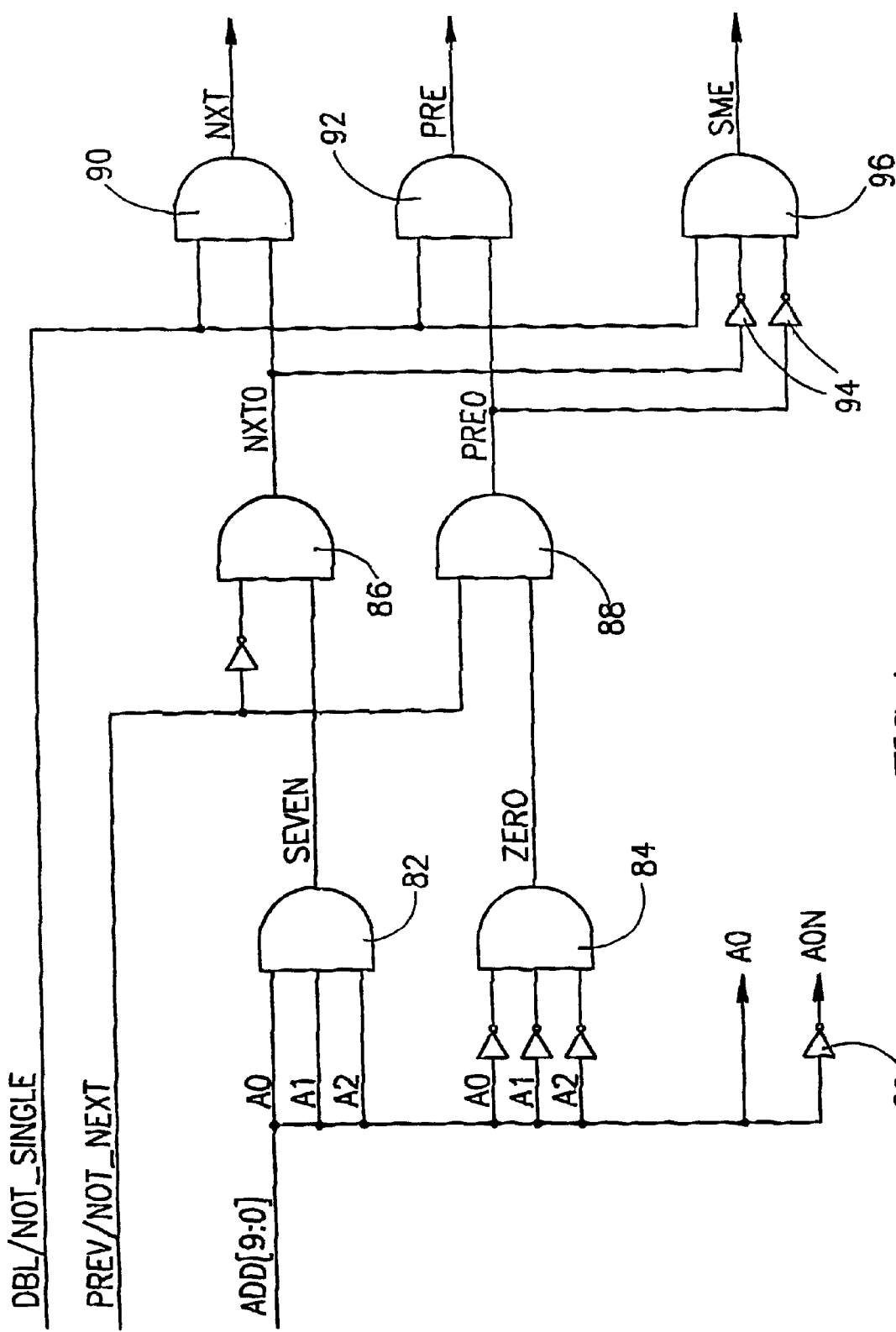
FIG. 4 is a circuit diagram of an exemplary multiple row main controller forming part of the memory array of FIG. 2.

Reference is now made to FIG. 4 which details an exemplary portion of a multiple row main controller which determines the PRE, NXT and SME signals. It will be appreciated that the main controller of FIG. 4 is by way of example only; the present invention incorporates all main controllers which can provide the signals which the half row line decoder 34 requires.

The main decoder of FIG. 4 receives the address ADD [9:0] of the main word and the direction signals DBL/not__ SINGLE and PREV/not__NEXT respectively indicating if one or two words are to be accessed and, if two words are to be accessed, which second word, the previous or the next one, is to be accessed. The main decoder of FIG. 4 comprises a plurality of logic gates which, from the input signals, produce the output signals of NXT, PRE, SME, A0 and A0N.

The address signal A0 is the lowest significant bit of the ADD signal and the A0N signal is its complement, produced through inverter 80. The three lowest bits, A0, A1 and A2 are provided to an AND gate 82 which produces a SEVEN signal which is high only if the three bits together represent the eighth word of a row, whose value is a multiple of eight less one. Similarly, the complements of the three lowest bits A0, A1 and A2 are provided to an AND gate 84 which produces a ZERO signal which is high only if the three bits together represent the first word of a row.

The SEVEN signal indicates that the main word is at the end of a row and, therefore, the second word must come from the next row. Therefore, the SEVEN signal is provided to a further AND gate 86 along with the complement of the PREV/not_NEXT signal (i.e. indicating to take the nextword). The output of AND gate 86 is a NXT0 signal which is high if the next row is required. The NXT0 signal and the DBL/not_SINGLE signal are provided to an AND gate 90 which produces the NXT signal only if the DBL/not_SINGLE signal is also high, indicating that two words are to be accessed simultaneously.

The ZERO signal indicates that the main word is at the beginning of a row and, therefore, the second word must come from the previous row. Therefore, the ZERO signal is provided to a further AND gate 88 along with the PREV/not_NEXT signal (i.e. indicating to take the previous word). The output of AND gate 88 is a PRE0 signal which is high if the previous row is required. The PRE0 signal and the DBL/not_SINGLE signal are provided to an AND gate 92 which produces the PRE signal only if the DBL/not_SINGLE signal is also high, indicating that two words are to be accessed simultaneously.

If neither the NXT0 nor the PRE0 signals are active, then the second word is on the same row as the main word. Therefore, the complements of the NXT0 and PRE0 signals, produced by inverters 94, are provided to an AND gate 96. In addition, the DBL/not_SINGLE signal is provided to AND gate 96 to indicate if two words are to be accessed. AND gate 96 produces the SME signal which is high if there is to be a second word and if that word is on the same row as the main word.

Figure 5:
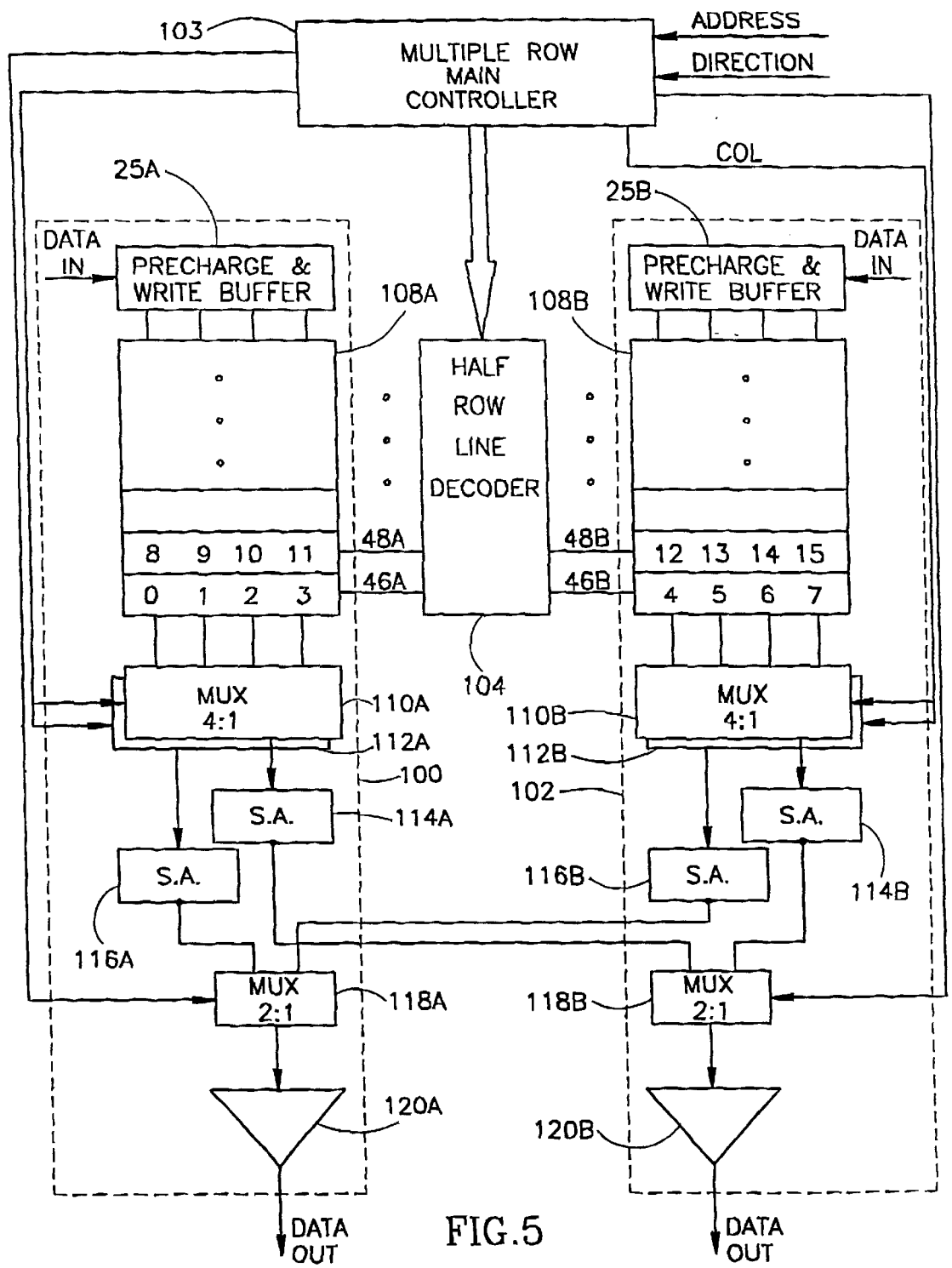
FIG. 5 is a schematic illustration of a memory array, constructed and operative in accordance with a second preferred embodiment of the present invention, wherein words which are X words apart can be generally simultaneously addressed.
Figure 6:
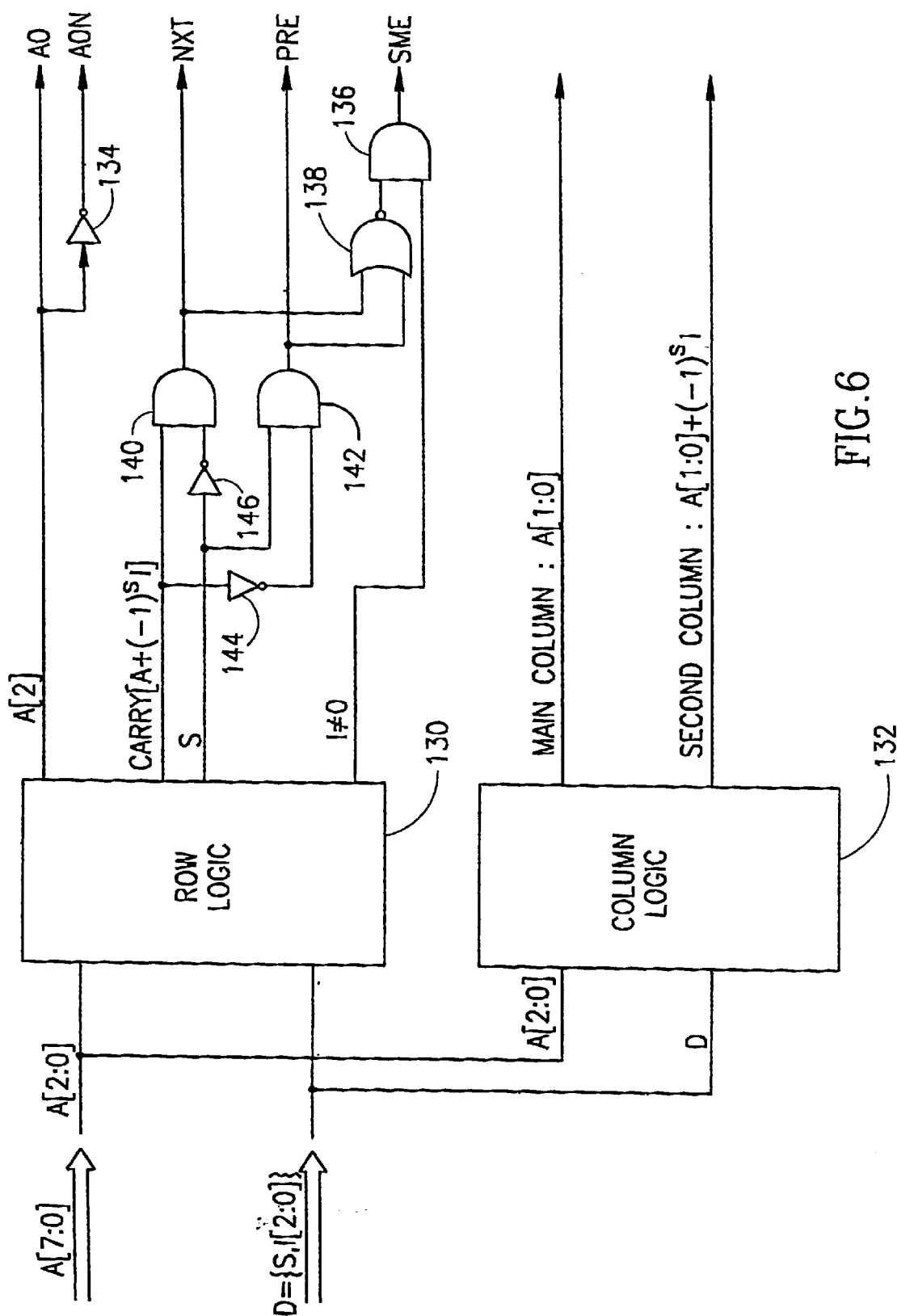
FIG. 6 is a schematic illustration of an exemplary multiple row main controller forming part of the memory array of FIG. 5.

Reference is now made to FIG. 5 which illustrates an alternative embodiment of the present invention which accesses words which are no more than 4 words apart. Reference is also made to FIG. 6 which illustrates details of an associated main controller.

The memory array of FIG. 5 comprises a left portion 100, a right portion 102, a multiple row main controller 103 and half-row line decoder 104. Each portion comprises a pre-charge and write buffer unit 25, memory unit 108, two 4:1 column MUXs 110 and 112, two sense amplifiers 114 and 116, an 2:1 output MUX 118 and a buffer 120 wherein the elements of the left portion 100 are denoted with an "A" and those of the right portion 102 with a "B".

In accordance with the second preferred embodiment of the present invention, the left memory unit 108A stores the first four words of any eight word set and the right memory unit 108B stores the second four words of the eight word set. Thus, the first row stores the words 0, 1, 2 and 3 in the left memory unit 108A and the words 4, 5, 6 and 7 in the right memory unit 108B.

Multiplexers 110 and 112 both are connected to the columns of their respective memory unit 108 and each selects one column for accessing. Sense amplifiers 114 and 116 respectively sense the output of 4:1 column multiplexers 110 and 112. 2:1 output multiplexer 118A receives the output of both sense amplifiers 116 and 2:1 output multiplexer 118B receives the output of both sense amplifiers 114.

If the two words to be accessed are stored in the same memory unit 108, for example, words 0 and 3 from the left memory unit 108A, both multiplexers 110A and 112A will be activated and the 2:1 output multiplexers 118 will be activated to select their "A" inputs. Similarly, if both words are stored in memory unit 108B, for example words 4 and 6, multiplexers 10B and 112B will be activated to select the two columns of memory unit 108B and the 2:1 output multiplexers 118 will be activated to select their "B" inputs.

If the two words are stored in separate memory units 108, for example, words 1 and 4 or words 7 and 10, then only one multiplexer 110 and one multiplexer 112 will be activated. For example, multiplexer 110A and multiplexer 112B might be activated, 2:1 output multiplexers 118 then select the output of their portion of the memory array. For the example above, 2:1 output multiplexer 118A selects its "A" input and 2:1 output multiplexer 118B selects its "B" input.

It will be appreciated that the memory array of FIG. 5 can select words which are up to three words apart. Sometimes the two words will be on the same row of one of the memory units 108 (e.g. words 1 and 3), sometimes the two words will be on the same row but in separate memory units 108 (e.g. words 3 and 5) and sometimes the two words will be on different rows of the two memory units 108 (e.g. words 7 and 10). Accordingly, half row line decoder 104 activates the appropriate half row or rows in accordance with the locations of the two words.

Half row line decoder 104 can be the same as half row line decoder 34 of FIGS. 2 and 3 and, therefore, will not be described in more detail. It is noted that half row line decoder selects the appropriate half rows to be activated. In this embodiment, when only one half row is required (for example for accessing words 1 and 3), half row line decoder 104 activates only the relevant half row 46A.

The multiple row main controller 103 receives the address of the main word and direction signals indicating how many words above or below the main word is the second word. From this information, main controller 103 determines the columns of the main and second words, the memory unit or units 108 in which the two words are stored and the half rows which access the two words. Main controller 103 provides column select signals to the relevant multiplexers 110 and 112 and output select signals to multiplexers 118 as described hereinabove.

In addition, main controller 103 provides the row address of the main word and the NXT, PRE and SME signals to the half row line decoder 104 as in the previous embodiment.

It will be appreciated that main controller 103 can be any suitable combination of logical elements which convert the word address and direction signals to the appropriate multiplexer select signals and half row line decoder signals. One exemplary embodiment is Illustrated in FIG. 6 in block diagram format.

The main controller 103. comprises a row logic unit 130 and a column logic 132, both of which receive an address variable A and a variable D formed of the sign S and a three bit interval variable I indicating the length of the interval between neighboring words,. The address can be any length, such as an eight bit address A[7:0]. The following table indicates the values of interval I and their associated bit-streams:

| Bit-stream | Interval Value |
|---|---|
| 000 | 0 |
| 001 | 1 |
| 010 | 2 |
| 011 | 3 |
| 100 | 4 |

The row logic unit 130 considers the lower three bits A[2:0] of the address, the sign variable S and the interval value I from them, produces five output signals. The bit A[2] indicates whether the word is in the first four or second four columns of the eight columns where the first four columns are in the left memory unit 108A and the second four columns are in the right memory unit 108B. Thus, the bit A[2] provides the address signal A0 and, via an inverter 134, the complement signal A0N.

The row logic unit 130 determines the sum of the lower three bits A[2:0] and the interval variable I (made positive or negative by the sign variable S) and produces carry signal indicating whether or not the sum creates a carry bit. Unit 130 also produces a "I≠0" signal which indicates whether the interval length I is not zero. Unit 130 puts out the following signals: the sign variable S the carry signal, the "I≠0" signal and the NXT, PRE and SME signals.

If there is a carry bit (carry=1) and the sign is positive (S=0), the NXT signal is activated. Thus, the NXT signal is produced by an AND gate 140 receiving the carry signal and the complement of the sign bit S, as produced by an inverter 146.

If there is not a carry bit (carry=0) and the sign is negative (S=1), the PRE signal is activated. Thus, the PRE signal is produced by an AND gate 142 receiving the sign bit S and the complement of the carry signal, as produced by an inverter 144.

If both the NXT and PRE signals are not activated, and the interval length I is not zero, then the two words are on the same row. Thus, the SME signal is produced by an AND gate 136 receiving the "≠0" signal and the output of a NOR gate 138 receiving the NXT signal and the PRE signal.

The column logic unit 132 considers the sign variable, the interval variable and the lower three bits A[2:0] of the address variable. The main column is the column identified by the bits A[1:0]. The second column is the column which is I columns (before or after) the main column. Thus, the second column is defined by the sum of the bits A[1:0] plus the bits of the interval I multiplied by the sign bit.

It will be appreciated by persons skilled in the art that the present invention is not limited to what has been particularly shown and described hereinabove. Rather the scope of the present invention is defined only by the claims which follow:

What is claimed is:

1. A memory array comprising:
    a memory unit for storing a multiplicity of words, said memory unit having a plurality of word lines each of which accesses a row of words, said memory unit divided into an even memory unit and an odd memory unit, respectively storing words with even addresses and words with odd addresses, said even memory unit having even half word lines and said odd memory unit having odd half word lines; and
    a half row line decoder for receiving a word line address N and for activating two half word lines, one which is part of word line N and one which is one word line above or below word line N, wherein said two half word lines are even and odd half word lines.

2. A memory array according to claim 1 and also comprising:
    two column multiplexers, one each for said even and odd memory units, for selecting a column of words of their associated memory unit; and
    a multiple row main controller for determining, from an externally provided first word address, said word line N, a first column address associated with said first word address, a second column address associated with a second word address one more or one less than said first word address, and at least one flag indicating the half word line associated with said second word address and for providing said first and second column addresses separately to said two column multiplexers and said word line N and said at least one flag to said half row line decoder.

3. A memory array according to claim 1 and wherein said half row line decoder comprises:
    a line decoder, connected to said full word lines, for activating the full word line N upon receipt of said word line address N;
    one even half word line selector associated with each even half word line, each said even half word line selector being connected between said line decoder and said associated even half word line; and
    one odd half word line selector associated with each odd half word line, each said odd half word line selector being connected between said line decoder and said associated odd half word line,
        wherein each odd half word line selector is connected to the even half word line selector of the row above said odd half word line selector and wherein each even half word line selector is connected to the odd half word line selector of the row below said even half word line selector.

4. A memory array according to claim 3 and wherein each left half word line selector comprises:
    an left AND gate receiving the complement of the least significant bit of a word address and a word line activation signal from said line decoder for the associated word line;
    a same line AND gate receiving said word line activation signal and a SME signal indicating if the two half word lines to be selected are from the same full word line;
    a next line AND gate receiving a signal from the right half word line selector of the word line below the current word line and a NXT signal indicating if the current left half word line is to be selected along with the next right half word line; and
    a result OR gate receiving the output of said left, same line and next line AND gates and connected, on output, to said current left half word line.

5. A memory array according to claim 3 and wherein each right half word line selector comprises:
    an right AND gate receiving the least significant bit of a word address and a word line activation signal from said line decoder for the associated word line;
    a same line AND gate receiving said word line activation signal and a SME signal indicating if the two half word lines to be selected are from the same full word line:
    a previous line AND gate receiving a signal from the left half word line selector of the word line above the current word line and a PRE signal indicating if the current right half word line is to be selected along with the previous left half word line; and If row line decoder.

6. A memory array according to claim 1 and wherein said half row line decoder comprises:
    a line decoder, connected to said full word lines, for activating the full word line N upon receipt of said word line address N;
    one even half word line selector associated with each even half word line, each said even half word line selector being connected between said line decoder and said associated even half word line; and
    one odd half word line selector associated with each odd half word line, each said odd half word line selector being connected between said line decoder and said associated odd half word line, wherein each odd half word line selector is connected to the even half word line selector of the row above said odd half word line selector and wherein each even half word line selector is connected to the odd half word line selector of the row below said even half word line selector.

7. A memory array according to claim 3 and wherein each left half word line selector comprises:
- an left AND gate receiving the complement of the least significant bit of a word address and a word line activation signal from said line decoder for the associated word line;
- a same line AND gate receiving said word line activation signal and a SME signal indicating if the two half word lines to be selected are from the same full word line;
- a next line AND gate receiving a signal from the right half word line selector of the word line below the current word line and a NXT signal indicating if the current left half word line is to be selected along with the next right half word line; and
- a result OR gate receiving the output of said left, same line and next line AND gates and connected, on output, to said current left half word line.

8. A memory array according to claim 3 and wherein each right half word line selector comprises:
- an right AND gate receiving the least significant bit of a word address and a word line activation signal from said line decoder for the associated word line;
- a same line AND gate receiving said word line activation signal and a SME signal indicating If the two half word lines to be selected are from the same full word line;
- a previous line AND gate receiving a signal from the left half word line selector of the word line above the current word line and a PRE signal indicating if the current right half word line is to be selected along with the previous left half word line; and
- a result OR gate receiving the output of said left, same line and previous line AND gates and connected, on output, to said current right half word line.

9. A memory array according to claim 1 and wherein said memory unit is one of the following types of memory units: read only memory, electrically programmable read only memory, electrically erasable programmable read only memory, and flash electrically erasable programmable read only memory.

* * * * *

UNITED STATES PATENT AND TRADEMARK OFFICE
CERTIFICATE OF CORRECTION

PATENT NO. : 6,407,961 B1
DATED : June 18, 2002
INVENTOR(S) : Perets, Ronen et al.

It is certified that error appears in the above-identified patent and that said Letters Patent is hereby corrected as shown below:

<u>Title page,</u>
Item [75], Inventors, please delete "Eran Briman, Kirlat Ono" and insert in lieu of
-- Eran Briman, Kiriat Ono --.

Signed and Sealed this

Twenty-ninth Day of October, 2002

Attest:

Attesting Officer

JAMES E. ROGAN
*Director of the United States Patent and Trademark Office*